(12) United States Patent
Okano

(10) Patent No.: US 8,146,049 B2
(45) Date of Patent: Mar. 27, 2012

(54) SUPPORT APPARATUS AND DESIGN SUPPORT METHOD

(75) Inventor: Motochika Okano, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 12/845,410

(22) Filed: Jul. 28, 2010

(65) Prior Publication Data

US 2011/0055795 A1 Mar. 3, 2011

(30) Foreign Application Priority Data

Aug. 31, 2009 (JP) ................................. 2009-200854

(51) Int. Cl.
*G06F 17/50* (2006.01)
(52) U.S. Cl. ....................................................... 716/137
(58) Field of Classification Search .................... 716/137
See application file for complete search history.

(56) References Cited

U.S. PATENT DOCUMENTS

| | | | | |
|---|---|---|---|---|
| 5,898,576 A * | 4/1999 | Lockwood et al. | ............ | 361/782 |
| 6,385,565 B1 * | 5/2002 | Anderson et al. | ............... | 703/18 |
| 6,532,439 B2 * | 3/2003 | Anderson et al. | ............... | 703/14 |
| 6,550,037 B2 | 4/2003 | Ando et al. | | |
| 6,573,767 B1 * | 6/2003 | Caldwell | ........................ | 327/143 |
| 7,797,824 B2 * | 9/2010 | Su | ................................... | 29/846 |
| 2001/0014963 A1 | 8/2001 | Ando et al. | | |
| 2001/0034587 A1 * | 10/2001 | Anderson et al. | .................. | 703/2 |
| 2006/0068582 A1 * | 3/2006 | Su | ................................ | 438/622 |
| 2009/0213558 A1 | 8/2009 | Osaka et al. | | |
| 2009/0248343 A1 | 10/2009 | Kashiwakura | | |
| 2010/0132191 A1 * | 6/2010 | Zhao et al. | ....................... | 29/852 |

FOREIGN PATENT DOCUMENTS

| | | |
|---|---|---|
| JP | 2001-167139 | 6/2001 |
| JP | 2002-073716 | 3/2002 |
| JP | 2003-133924 | 9/2003 |
| JP | 2006-352059 | 12/2006 |
| JP | 2009-223885 | 1/2009 |
| JP | 2009-230694 | 8/2009 |

OTHER PUBLICATIONS

Japanese Patent Application No. 2009-200854; Notice of Reasons for Rejection; Mailed Mar. 8, 2011 (English translation).
Japanese Patent Application No. 2009-200854; Notice of Reasons for Rejection; Mailed Dec. 21, 2010 (English translation).
Japanese Patent Application No. 2009-200854; Notice of Reasons for Rejection; Mailed Oct. 26, 2010 (English translation).

* cited by examiner

*Primary Examiner* — Suchin Parihar
(74) *Attorney, Agent, or Firm* — Blakley, Sokoloff, Taylor & Zafman LLP

(57) ABSTRACT

According to one embodiment, a design support apparatus determines one of a first impedance between a power plane and a ground plane in the printed circuit board at an ON time of a high-side transistor in the switching power supply, a second impedance between the power plane and the ground plane at an ON time of a low-side transistor in the switching power supply, and a third impedance in an intermediate range between the first impedance and the second impedance to be an impedance between the power plane and the ground plane, based on ON-time information indicative of a ratio of an ON period of the high-side transistor to a switching cycle of the switching power supply in an operation period of the device. The apparatus evaluates capacitor information included in design information of the printed circuit by comparing the determined impedance and a target impedance.

10 Claims, 9 Drawing Sheets

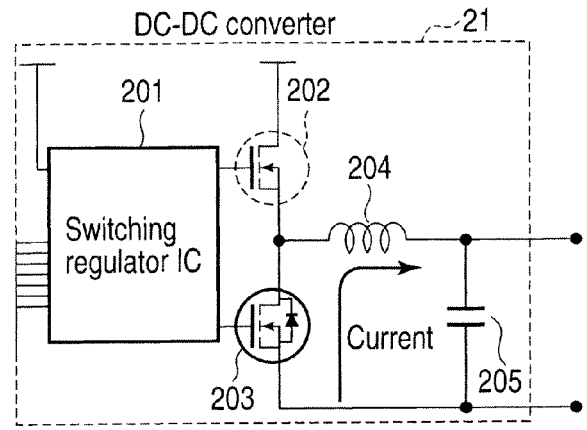
F I G. 7
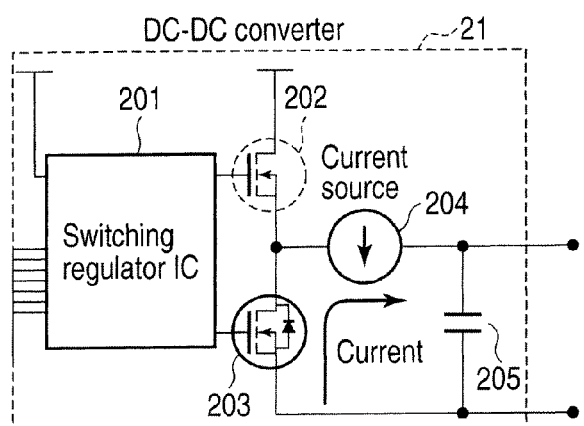
F I G. 8
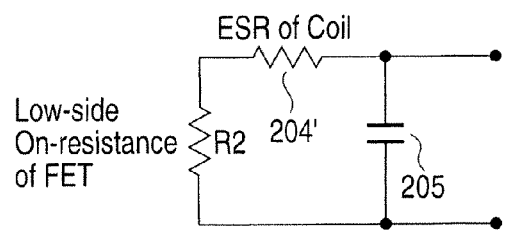
F I G. 9

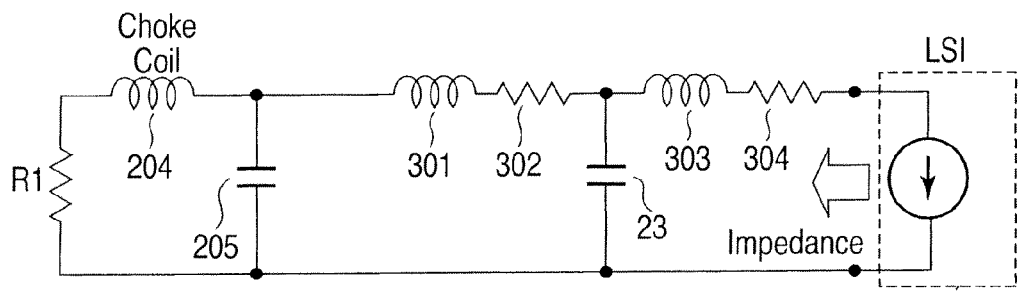
F I G. 10
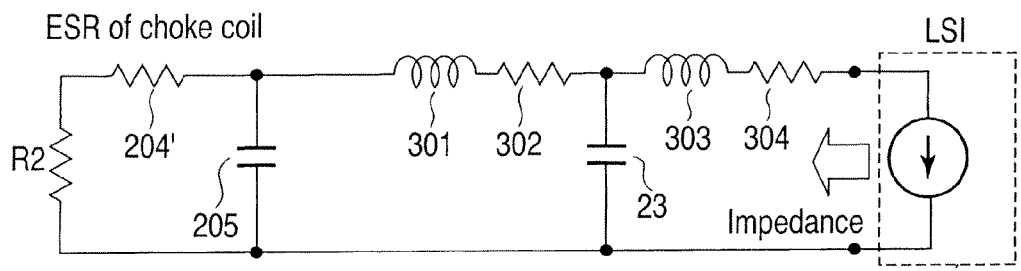
F I G. 11
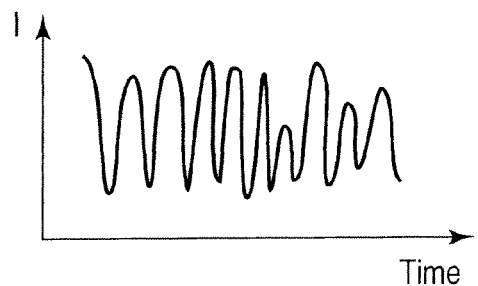
F I G. 12
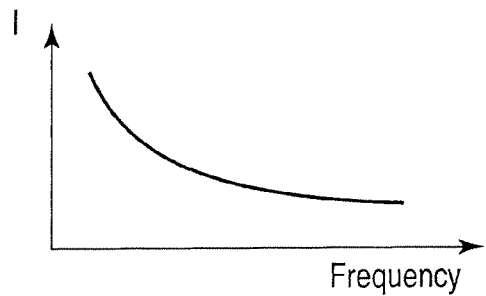
F I G. 13

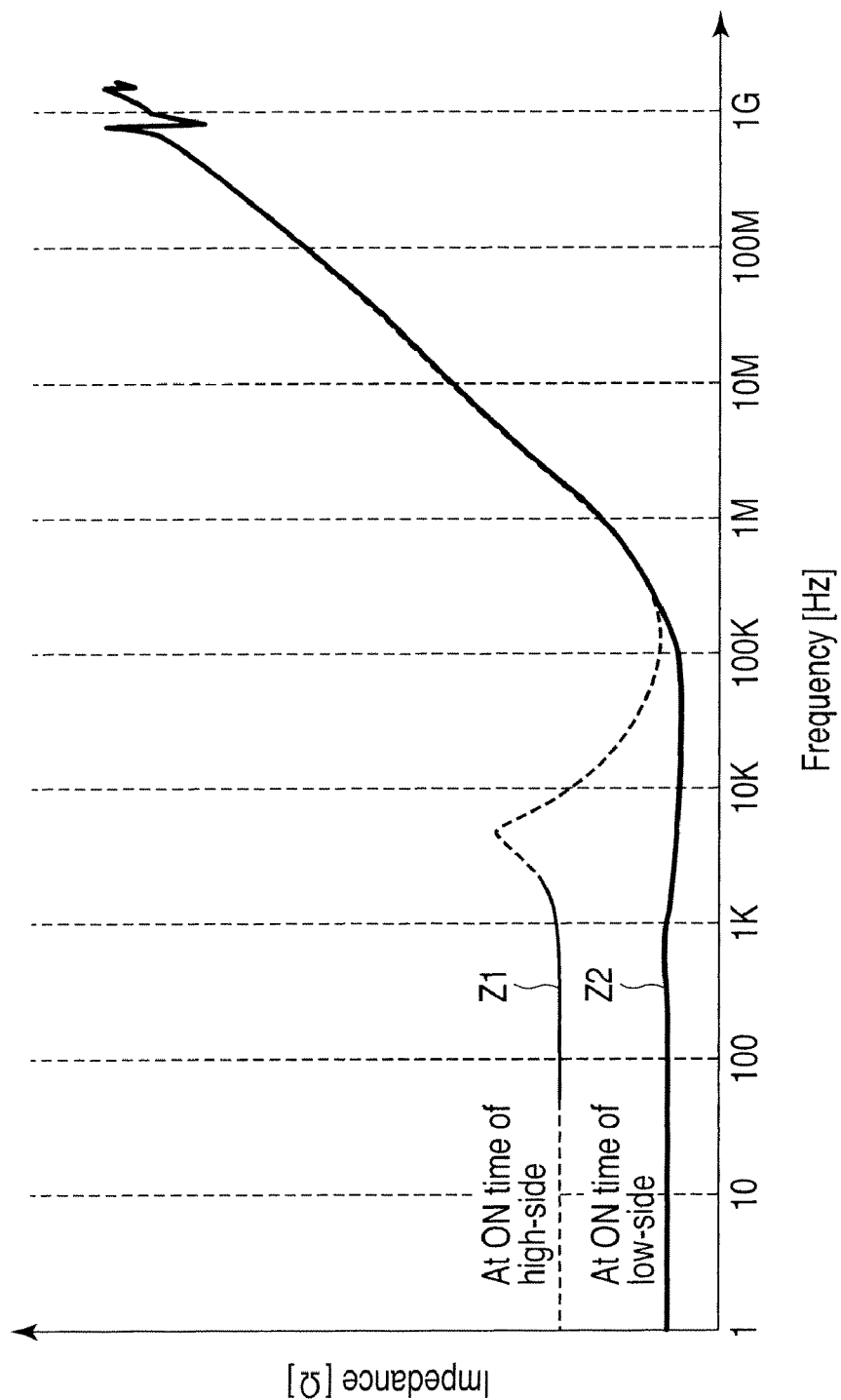
F I G. 15

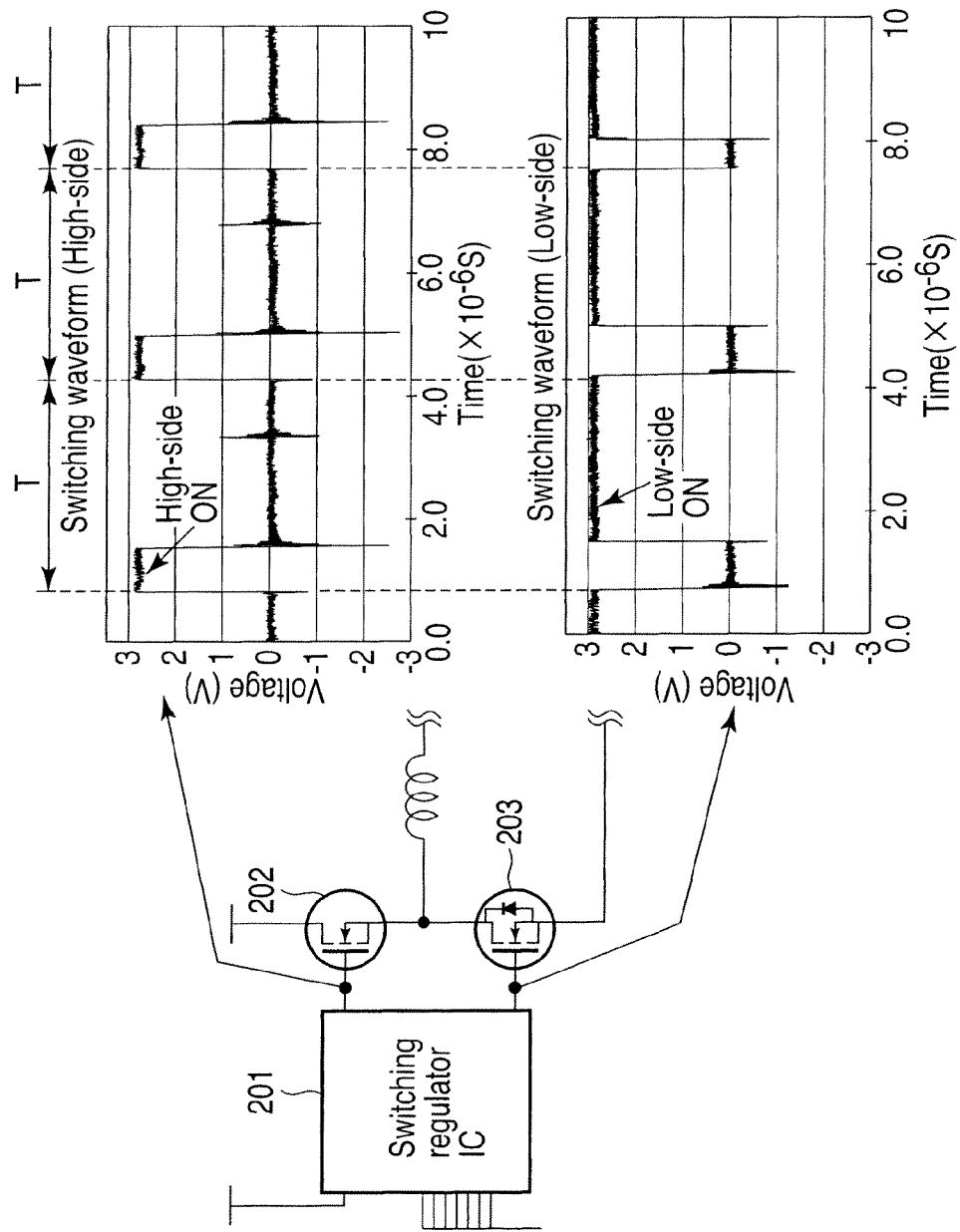
F I G. 16

SUPPORT APPARATUS AND DESIGN SUPPORT METHOD

CROSS-REFERENCE TO RELATED APPLICATIONS

This application is based upon and claims the benefit of priority from Japanese Patent Application No. 2009-200854, filed Aug. 31, 2009; the entire contents of which are incorporated herein by reference.

FIELD

Embodiments described herein relate generally to a technique for supporting designing of a printed circuit board, for example, a technique for optimizing the capacitance of a decoupling capacitor mounted on a printed circuit board or the number of decoupling capacitors mounted on the printed circuit board.

BACKGROUND

In general, in a printed circuit board, a decoupling capacitor is amounted in order to secure a sufficient power integrity. The decoupling capacitor is used in order to suppress a variation in power supply voltage which is supplied to an LSI on the printed circuit board. The decoupling capacitor is connected between a power plane and a ground plane in the printed circuit board. The impedance (power supply-ground impedance) between the power plane and the ground plane is reduced by the decoupling capacitor. Accordingly, the decoupling capacitor is capable of functioning to improve the power integrity or, in other words, functioning to stabilize the power supply voltage which is supplied to the LSI. A power supply voltage variation ΔV on the printed circuit board can generally be expressed by the following equation:

$$\Delta V = Z \times I$$

where Z is the power supply-ground impedance, and I is the electric current which is drawn from the power plane by the LSI. With the increase in speed of the LSI, there is a tendency that the current I becomes larger. Thus, recently, the measure for reducing the power supply voltage variation ΔV has become very important.

The power supply voltage variation ΔV needs to be suppressed to a range less than the maximum tolerable voltage drop (also referred to as "maximum tolerable noise voltage") which is stipulated by the specifications of the LSI. For this purpose, it is necessary to lower the power supply-ground impedance Z to below a target impedance $Z_T$ by disposing the decoupling capacitor on the printed circuit board.

The target impedance $Z_T$ can generally be expressed by the following equation:

$$Z_T = \text{maximum tolerable voltage drop}/I$$

where the maximum tolerable voltage drop is expressed by a product between a power supply voltage V and a tolerable voltage error %.

Jpn. Pat. Appln. KOKAI Publication No. 2006-352059 discloses a digital signal processing board on which a decoupling capacitor, which is connected between a power supply input line and a ground, is mounted. In this digital signal processing board, as the decoupling capacitor, use is made of an electrolytic capacitor having an equivalent series resistance of 25 mΩ and an equivalent series inductance of 800 pH.

As has been described above, the decoupling capacitor is useful in improving the power integrity of the printed circuit board. However, strictly speaking, the power supply-ground impedance of the printed circuit board is different between when a high-side transistor in a switching power supply, which is mounted on the printed circuit board, is turned on, and when a low-side transistor in the switching power supply is turned on. The power supply-ground impedance at the time when the high-side transistor is turned on is higher than the power supply-ground impedance at the time when the low-side transistor is turned on. The reason for this is that the coil in the switching power supply functions as an inductor when the high-side transistor is turned on, whereas the coil functions not as an inductor but as a power source (resistor) when the low-side transistor is turned on. The impedance of the inductor increases as the frequency becomes lower. Thus, in a low frequency region, the power supply-ground impedance at the time when the high-side transistor is turned on becomes higher than the power supply-ground impedance at the time when the low-side transistor is turned on.

In this manner, the power supply-ground impedance varies depending on the operation state of the switching power supply which is mounted on the printed circuit board. The operation state of the switching power supply, that is, the ratio of the ON time of the high-side transistor to the switching cycle, varies depending on the amount of current consumption of a device, such as a processor, which is mounted on the printed circuit board. In a printed circuit board on which a device, such as a high-capability processor, is mounted, the ratio of the ON time of the high-side transistor is relatively high. On the other hand, in a printed circuit board on which a device, such as a low-capability or middle-capability processor, is mounted, the ratio of the ON time of the high-side transistor is relatively low and, in some cases, the ON time of the low-side transistor occupies the major part of the switching cycle.

However, in the conventional design of the printed circuit board, no sufficient consideration has been given to the operation state of the switching power supply. It is thus possible that an excessive number of decoupling capacitors, or a decoupling capacitor with an excessive capacitance, is disposed in order that the power supply-ground impedance may be set to be lower than a target impedance over the entire frequency band.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 7 is an exemplary view for explaining the operation at a time of a current mode of the switching power supply (DC to DC converter) which is mounted on the printed circuit board shown in FIG. 2;

FIG. 8 is an exemplary view for explaining the operations of the high-side transistor and low-side transistor at the time of the current mode of the switching power supply (DC to DC converter) which is mounted on the printed circuit board shown in FIG. 2;

FIG. 9 shows an equivalent circuit of the switching power supply (DC to DC converter) mounted on the printed circuit board shown in FIG. 2 at the time when the switching power supply is in the current mode;

FIG. 10 shows an equivalent circuit of a power supply path at a time when the switching power supply (DC to DC converter) mounted on the printed circuit board shown in FIG. 2 is in the voltage mode;

FIG. 11 shows an equivalent circuit of a power supply path at a time when the switching power supply (DC to DC converter) mounted on the printed circuit board shown in FIG. 2 is in the current mode;

FIG. 12 is an exemplary graph showing a variation of an electric current with time, which flows in a power plane of the printed circuit board shown in FIG. 2;

FIG. 13 is an exemplary graph showing frequency characteristics of a current flowing in the power plane of the printed circuit board shown in FIG. 2;

FIG. 15 is an exemplary graph showing an example of a power supply-ground impedance of the printed circuit board shown in FIG. 2;

FIG. 16 shows examples of signal waveforms of switching control signals of the switching power supply (DC to DC converter) mounted on the printed circuit board shown in FIG. 2.

DETAILED DESCRIPTION

Various embodiments will be described hereinafter with reference to the accompanying drawings.

In general, according to one embodiment, a design support apparatus supports design of a printed circuit board on which a device and a switching power supply, which supplies power to the device, are mounted. The design support apparatus comprises a calculation module, a determination module and an evaluation module.

The calculation module is configured to calculate, based on design information of the printed circuit board including capacitor information indicative of characteristics of at least one decoupling capacitor, a first impedance between a power plane and a ground plane in the printed circuit board at an ON time of a high-side transistor in the switching power supply, and a second impedance between the power plane and the ground plane at an ON time of a low-side transistor in the switching power supply. The determination module is configured to determine one of the first impedance, the second impedance and a third impedance in an intermediate range between the first impedance and the second impedance to be an impedance between the power plane and the ground plane, based on ON-time information indicative of a ratio of an ON period of the high-side transistor to a switching cycle of the switching power supply in an operation period of the device. The evaluation module is configured to evaluate the capacitor information by comparing the determined impedance and a target impedance.

Figure 1:
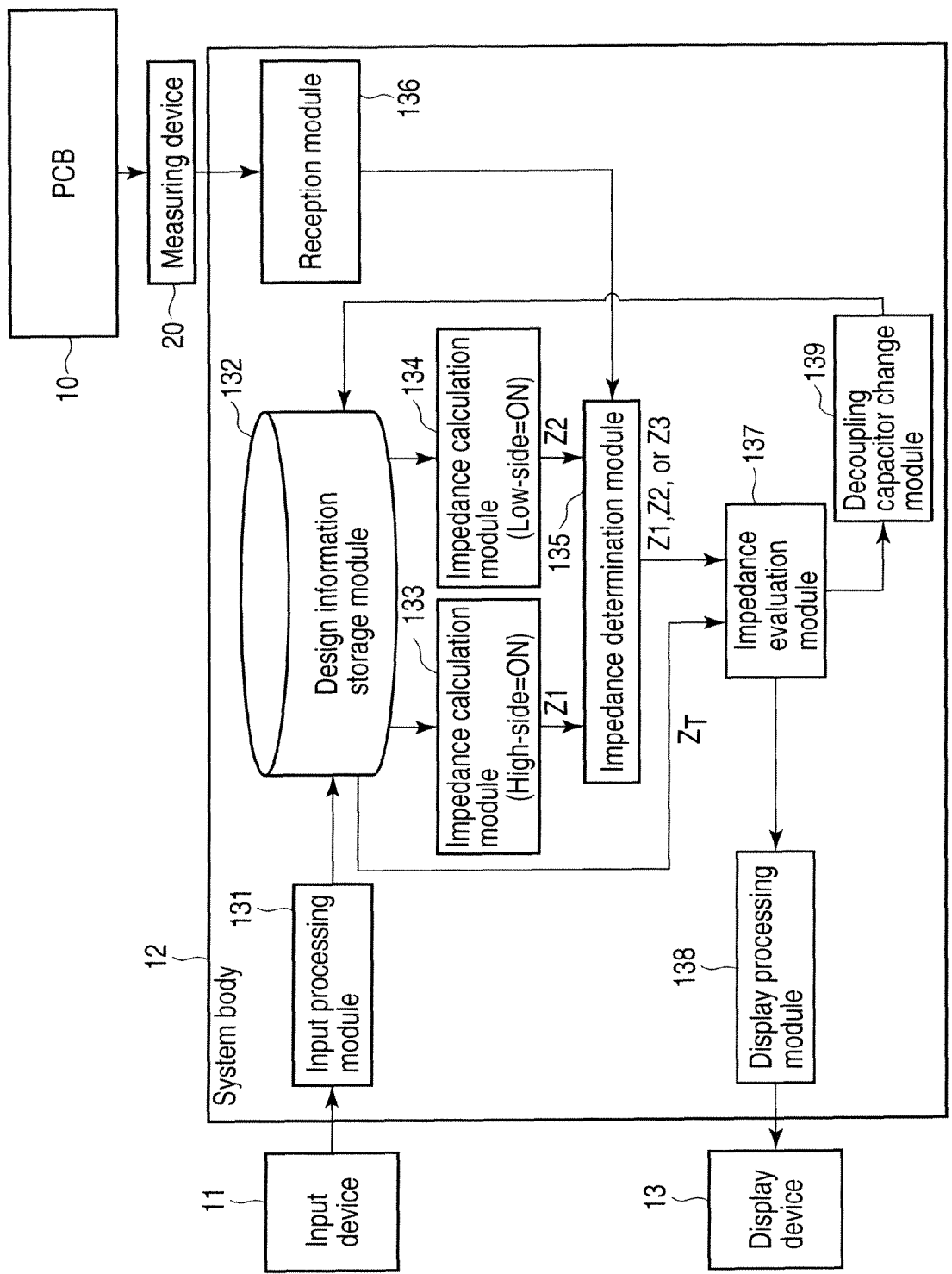
FIG. 1 is an exemplary block diagram showing an example of the system configuration of a design support apparatus according to an embodiment.

FIG. 1 shows an example of the structure of a design support apparatus according to an embodiment. The design support apparatus is realized as a CAD apparatus which supports designing of a printed circuit board (PCB). The printed circuit board that is the object of design is, for instance, a system board (motherboard) of a computer. On the printed circuit board that is the object of design, at least a switching power supply, such as a DC to DC converter, and a device (e.g. a processor such as a CPU), which is driven by power from the switching power supply, are mounted.

The design support apparatus is realized, for example, by a computer. The design support apparatus comprises an input device 11, a system body 12 and a display device 13. The input device 11 is, for instance, a keyboard or a mouse of the computer. The display device 13 is a display of the computer. The system body 12 is realized, for example, by a CPU, a memory and an I/O controller of the computer. The operation of the system body 12 is controlled by a design support program which is software executed by the CPU. The system body 12 has, as one of functions for supporting designing of the printed circuit board, a decoupling capacitor evaluation function for optimizing the number of decoupling capacitors which are to be mounted on the printed circuit board that is the object of design, or optimizing the capacitance of each of the decoupling capacitors.

As has been described above, the impedance (power supply-ground impedance) between the power plane and ground plane in the printed circuit board varies depending on the operation state of the switching power supply mounted on the printed circuit board (the ratio of the ON period of the high-side transistor to the switching cycle). Thus, the decoupling capacitor evaluation function of the present embodiment calculates a proper power supply-ground impedance, based on the ratio of the ON period of the high-side transistor to the switching cycle. In addition, by the comparison between the calculated impedance and the target impedance, the decoupling capacitor evaluation function optimizes the number of decoupling capacitors which are to be mounted on the printed circuit board that is the object of design, or optimizes the capacitance of each of the decoupling capacitors which are to be mounted.

As has been described above, in the low frequency region, the power supply-ground impedance at the time when the high-side transistor in the switching power supply is turned on is higher than the power supply-ground impedance at the time when the low-side transistor in the switching power supply is turned on. The ratio of the ON time of the high-side transistor to the switching cycle varies depending on the current consumption of a device, such as a processor, which is mounted on the printed circuit board. In a printed circuit board on which a device, such as a high-capability processor, is mounted, the ratio of the ON time of the high-side transistor is relatively high. On the other hand, in a printed circuit board on which a device, such as a low-capability or middle-capability processor, is mounted, the ratio of the ON time of the high-side transistor is relatively low and, in some cases, the ON time of the low-side transistor occupies the major part of the switching cycle.

Accordingly, for example, when a printed circuit board on which a device, such as a high-capability processor, is mounted is to be designed, or in other words, when the ratio of the ON time of the high-side transistor of the switching power supply mounted on the printed circuit board that is the object of design is higher than a certain threshold, it becomes necessary to determine the capacitance of each of decoupling capacitors which are to be mounted and the number of decoupling capacitors which are to be mounted, so that the power supply-ground impedance at the time when the high-side transistor is turned on becomes lower than the target impedance. On the other hand, when a printed circuit board on which a device, such as a low-capability processor, is mounted is to be designed, or in other words, when the ratio of the ON time of the high-side transistor of the switching power supply mounted on the printed circuit board that is the object of design is lower than a certain threshold, it should suffice if the capacitance of each of decoupling capacitors which are to be mounted and the number of decoupling capacitors which are to be mounted are determined so that the power supply-ground impedance at the time when the low-side transistor is turned on becomes lower than the target impedance.

Based on the ratio of the ON period of the high-side transistor to the switching cycle in the period of the operation of the device, the decoupling capacitor evaluation function of the embodiment determines one of a power supply-ground impedance $Z1$ at the ON time of the high-side transistor, a power supply-ground impedance $Z2$ at the ON time of the low-side transistor and an impedance $Z3$ in an intermediate region between the impedance $Z1$ and impedance $Z2$ as a proper power supply-ground impedance for the printed circuit board that is the object of design. Accordingly, when the printed circuit board on which a device, such as a high-capability processor, is mounted is to be designed, the impedance $Z1$ is determined as a proper power supply-ground impedance for the printed circuit board. On the other words, when the printed circuit board on which a device, such as a low-capability processor, is mounted is to be designed, the impedance $Z2$ or impedance $Z3$ can be determined as a proper power supply-ground impedance for the printed circuit board. As a result, when the printed circuit board on which a device, such as a low-capability processor, is mounted is to be designed, the design standard of the impedance in the low frequency region can be relaxed. Therefore, it is possible to prevent decoupling capacitors from being excessively disposed, and it is possible to optimize the number of decoupling capacitors which are to be mounted on the printed circuit board that is the object of design, or the capacitance of each of the decoupling capacitors which are to be mounted.

As the above-described impedance $Z3$, for example, use may be made of (1) a middle value between $Z1$ and $Z2$, (2) a value higher than the middle value between $Z1$ and $Z2$ and lower than $Z1$, or (3) a value lower than the middle value between $Z1$ and $Z2$ and higher than $Z2$. One of (1), (2) and (3), which is to be used, can be selected according to the ratio of the ON time of the high-side transistor.

In this manner, by determining the proper power supply-ground impedance for the printed circuit board that is the object of design, in consideration of the operation state of the switching power supply, it becomes possible to prevent such a situation from occurring that an excessive number of decoupling capacitors or a decoupling capacitor with an excessive capacitance is disposed. It is thus possible to support optimization of the number of decoupling capacitors which are to be disposed on the printed circuit board, or the capacitance of each decoupling capacitor which is to be disposed.

In order to realize the above-described decoupling capacitor evaluation function, the system body 12 includes an input processing module 131, a design information storage module 132, a first impedance calculation module 133, a second impedance calculation module 134, an impedance determination module 135, a reception module 136, an impedance evaluation module 137, an impedance display module 138 and a decoupling capacitor change module 139.

The input processing module 131 is used in order to process data and a command (CAD operation command) which are input from the input device 11. The design information storage module 132 is realized by a storage device such as a hard disk drive. The design information storage module 132 stores design information of the printed circuit board that is the object of design. The design information includes capacitor information indicative of the characteristics (e.g. capacitance) of one or more decoupling capacitors which are to be mounted on the printed circuit board that is the object of design. Further, the design information includes wiring information and component information. The component information includes information indicative of the electrical characteristics of a switching power supply circuit which is mounted on the printed circuit board, and information indicative of the electrical characteristics of a device (e.g. a processor) which is mounted on the printed circuit board.

The first impedance calculation module 133 calculates, based on the above-described design information, the power supply-ground impedance $Z1$ at the ON time of the high-side transistor in the switching power supply. An example of calculation of the power supply-ground impedance $Z1$ will be described later with reference to FIG. 10. The second impedance calculation module 134 calculates, based on the above-described design information, the power supply-ground impedance $Z2$ at the ON time of the low-side transistor in the switching power supply. An example of calculation of the power supply-ground impedance $Z2$ will be described later with reference to FIG. 11.

The reception module 136 receives ON-time information which is associated with the printed circuit board that is the object of design. The ON-time information indicates the ratio of the ON period of the high-side transistor to the switching cycle in the operation period of the device. The reception module 136 can receive the ON time information, for example, from a measuring device 20 for measuring a board (PCB) 10 for evaluation. The board 10 for evaluation is a board for evaluating the operation of the printed circuit board that is the object of design. On the board 10 for evaluation, there are actually disposed a switching power supply having the same characteristics as the switching power supply which is to be mounted on the printed circuit board that is the object of design, and a device having the same characteristics as the device which is to be mounted on the printed circuit board that is the object of design. The measuring device 20 measures, with use of the board 10 for evaluation, the ratio of the ON period of the high-side transistor to the switching cycle of the switching power supply of the board 10 for evaluation, thereby generating the above-described ON-time information and sends the generated ON-time information to the reception module 136. The measurement of the ratio of the ON period of the high-side transistor by the measuring device 20 is performed in the state in which the device on the board 10 for evaluation is operating. When a processor, such as a CPU, is used as the device, the ratio of the ON period of the high-side transistor may be measured while the processor is caused to execute software such as a test program. A synchroscope, for instance, is usable as the measuring device 20.

Instead of sending the ON-time information from the measuring device 20 to the reception module 136, the designer may observe the signal waveform which is displayed on the display of the measuring device 20, and the designer himself/herself may input the data indicative of the ratio of the ON period of the high-side transistor through the input device 11. In this case, the reception module 136 receives the ON-time information from the input device 11.

Based on the ON-time information, the impedance determination module 135 determines one of the impedance Z1, the impedance Z2 and the impedance Z3 in the intermediate region between the impedance Z1 and impedance Z2 to be the proper power supply-ground impedance for the printed circuit board that is the object of design. For example, if the ratio of the ON period of the high-side transistor is greater than a certain threshold A, the impedance determination module 135 determines the impedance Z1 to be the proper power supply-ground impedance. On the other hand, if the ratio of the ON period of the high-side transistor is less than a threshold B, the impedance determination module 135 determines the impedance Z2 to be the proper power supply-ground impedance. A value less than the threshold A is usable as the threshold B. In addition, if the ratio of the ON period of the high-side transistor is less than the threshold A and not less than the threshold B, the impedance determination module 135 determines the impedance Z3 to be the proper power supply-ground impedance.

In the meantime, the threshold A may be equal to the threshold B. In this case, if the ratio of the ON period of the high-side transistor is greater than the threshold A, the impedance determination module 135 may determine the impedance Z1 to be the proper power supply-ground impedance. If the ratio of the ON period of the high-side transistor is not greater than the threshold A, the impedance determination module 135 may determine the impedance Z2 to be the proper power supply-ground impedance.

The impedance evaluation module 137 evaluates the present capacitor information by comparing the determined power supply-ground impedance and a target impedance $Z_T$. An evaluation result, for instance, the relationship in magnitude between the determined power supply-ground impedance and the target impedance $Z_T$, is displayed on the display (on the design screen of the display device 13) by the display processing module 138.

Based on the evaluation result of the impedance evaluation module 137, the decoupling capacitor change module 139 changes the capacitor information. To be more specific, if the determined power supply-ground impedance is sufficiently lower than the target impedance $Z_T$, the decoupling capacitor change module 139 changes the capacitor information so that the number of decoupling capacitors used is decreased or the capacitance of the decoupling capacitor used is decreased. If the determined power supply-ground impedance is higher than the target impedance $Z_T$, the decoupling capacitor change module 139 changes the capacitor information so that the number of decoupling capacitors used is increased or the capacitance of the decoupling capacitor used is increased.

Figure 2:
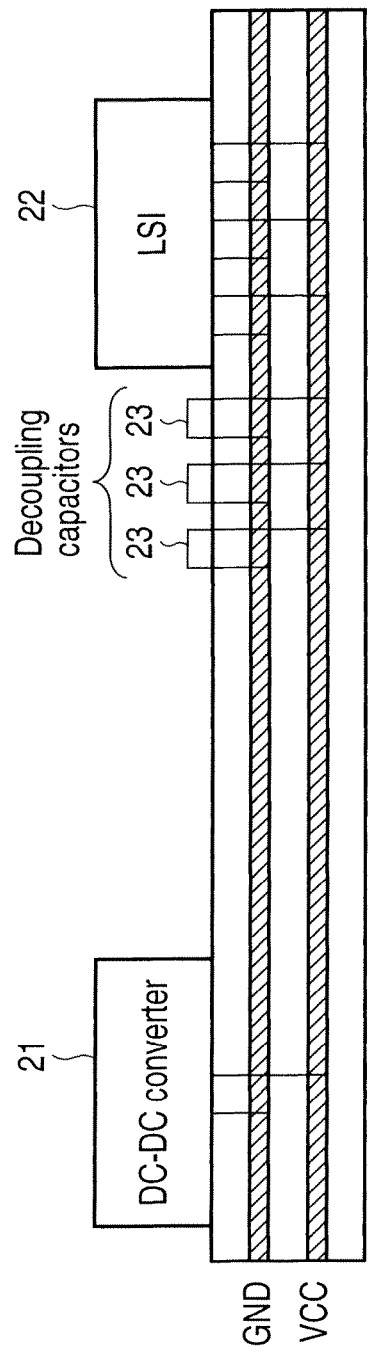
FIG. 2 is an exemplary cross-sectional view of a printed circuit board, which is an object of design, in the design support apparatus of the embodiment.

FIG. 2 is a cross-sectional view showing the structure of a printed circuit board that is the object of design. The printed circuit board is composed of, for example, a multilayer substrate, and includes a power plane VCC and a ground plane GND. The power plane VCC and ground plane GND are realized by different inner planes within the printed circuit board. A DC to DC converter 21 and an LSI 22 are mounted on the printed circuit board. The DC to DC converter 21 is the above-described switching power supply. The DC to DC converter 21 is realized by a synchronous rectification type switching power supply circuit including a high-side transistor and a low-side transistor. The LSI 22 is the above-described device. A power supply terminal and a ground terminal of the DC to DC converter 21 are connected to the power plane VCC and ground plane GND, respectively. Similarly, a power supply terminal and a ground terminal of the LSI 22 are connected to the power plane VCC and ground plane GND, respectively. Power from the DC to DC converter 21 is supplied to the LSI 22 via the power plane VCC.

One or more decoupling capacitors 23 are mounted on the printed circuit board. Each decoupling capacitor 23 is connected between the power plane VCC and ground plane GND. In usual cases, in order to secure the power integrity over the entire frequency band, one or more ceramic capacitors for reducing the impedance in the high frequency region and one or more electrolytic capacitors for reducing the impedance in the low frequency region are used as the decoupling capacitors 23. In the present embodiment, since the design restrictions of the impedance in the low frequency region can be relaxed, it is possible to realize the reduction in capacitance of the electrolytic capacitor or the reduction in number of electrolytic capacitors.

Figure 3:
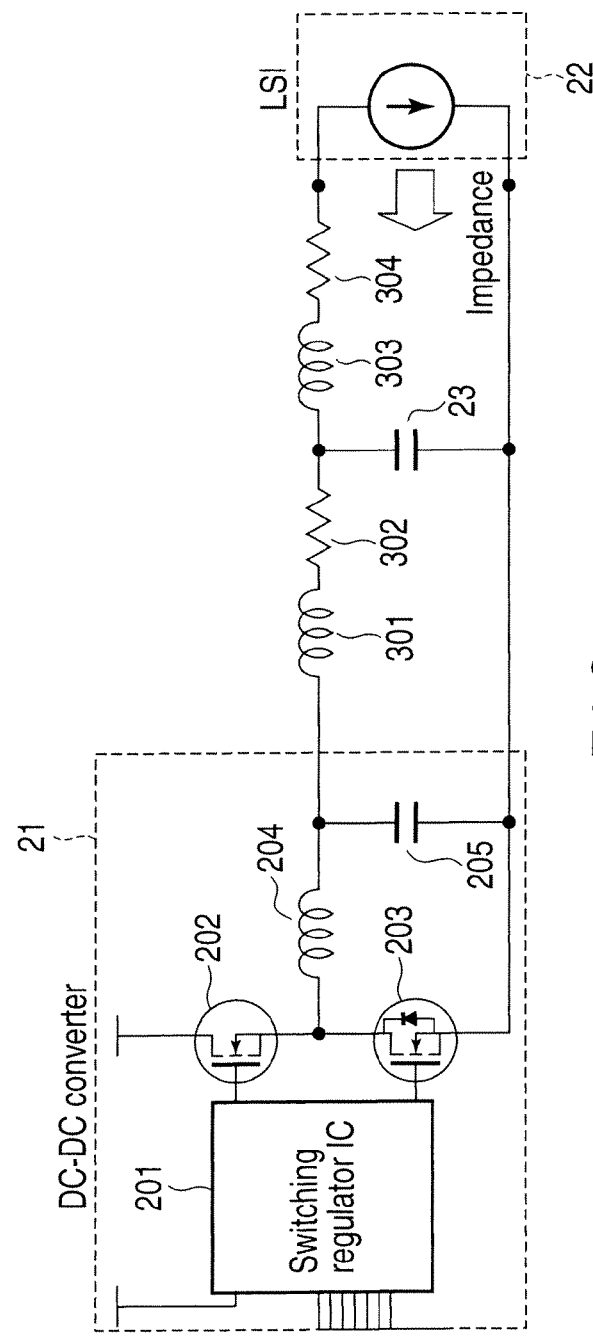
FIG. 3 shows an equivalent circuit of a power supply path in the printed circuit board shown in FIG. 2.

FIG. 3 shows an equivalent circuit of a power supply path in the printed circuit board shown in FIG. 2. The DC to DC converter 21 is realized by a switching regulator IC 201, a high-side FET 202, a low-side FET 203, a coil (choke coil) 204, and a capacitor 205. The coil 204 and capacitor 205 function as a smoothing circuit. The switching regulator IC 201 is of a synchronous rectification type, and controls the switching of the high-side FET 202 and low-side FET 203. In each switching cycle, the low-side FET 203 is turned off while the high-side FET 202 is turned on. In each switching cycle, if the high-side FET 202 is switched from the ON state to the OFF state, the low-side FET 203 is switched from the OFF state to the ON state. As the ON period of the high-side FET 202 is longer in each switching cycle, the output power supply voltage of the DC to DC converter 21 becomes higher. The switching regulator IC 201 controls the ON period of the high-side FET 202 in each switching cycle, so that the output power supply voltage of the DC to DC converter 21 may be kept at a constant value.

In FIG. 3, reference numeral 301 denotes a parasitic inductance in the power plane VCC, numeral 302 denotes a parasitic resistance in the power plane VCC, numeral 303 denotes an inductance in the package of the LSI 22, and numeral 304 denotes a resistance in the package of the LSI 22.

Figure 4:
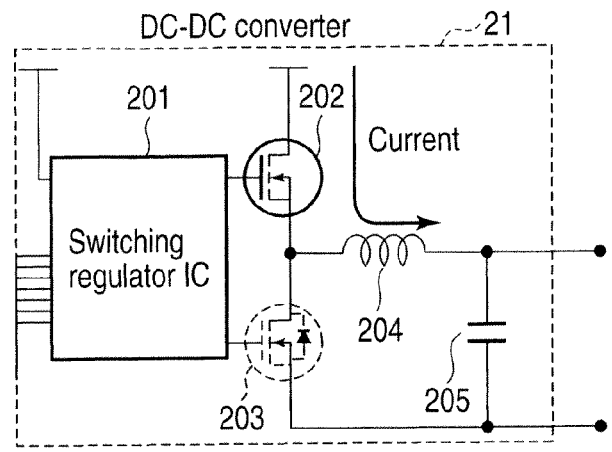
FIG. 4 is an exemplary view for explaining the operation at a time of a voltage mode of a switching power supply (DC to DC converter) which is mounted on the printed circuit board shown in FIG. 2.
Figure 5:
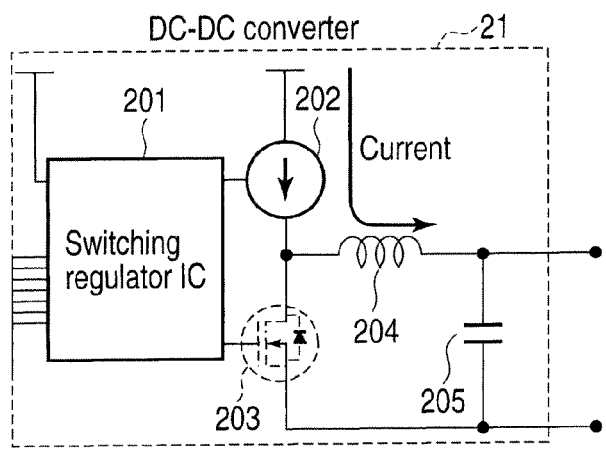
FIG. 5 is an exemplary view for explaining the operations of a high-side transistor and a low-side transistor at the time of the voltage mode of the switching power supply (DC to DC converter) which is mounted on the printed circuit board shown in FIG. 2.

FIG. 4 illustrates the operation at a time of a voltage mode (the high-side FET is "ON") of the DC to DC converter 21. The state of the DC to DC converter 21 is switched between the open loop of the voltage mode and the closed loop of the current mode. In the open loop of the voltage mode, the high-side FET 202 is turned on, and the high-side FET 202 functions as a current source, as shown in FIG. 5. In the open loop of the voltage mode, as shown in FIG. 5, the low-side FET 203 is turned off.

Figure 6:
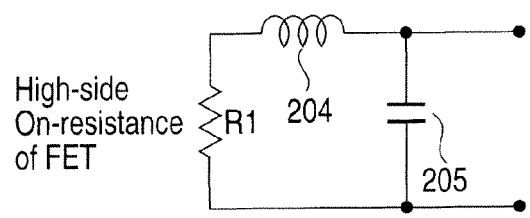
FIG. 6 shows an equivalent circuit of the switching power supply (DC to DC converter) mounted on the printed circuit board shown in FIG. 2 at the time when the switching power supply is in the voltage mode.

FIG. 6 shows an equivalent circuit of the DC to DC converter 21 at the time of the open loop of the voltage mode. A resistor R1 is an ON-resistance of the high-side FET 202.

FIG. 7 illustrates the operation at a time of the current mode (the low-side FET is "ON") of the DC to DC converter 21. In the closed loop of the current mode, the low-side FET 203 is turned, and the coil 204 functions as a current source, as shown in FIG. 8. In the closed loop of the current mode, as shown in FIG. 8, the high-side FET 202 is turned off.

FIG. 9 shows an equivalent circuit of the DC to DC converter 21 at the time of the closed loop of the current mode. A resistor R2 is an ON-resistance of the low-side FET 203. Numeral 204' denotes an equivalent series resistance (ESR) of the coil 204.

FIG. 10 shows an equivalent circuit of a power supply path at the time of the open loop of the voltage mode. An impedance of the equivalent circuit, as viewed from the LSI 22, is a power supply-ground impedance Z1 at the time when the high-side transistor (high-side FET 202) is turned on. The values of the resistances, inductances and capacitances included in the equivalent circuit of FIG. 10 are given by design information.

FIG. 11 shows an equivalent circuit of a power supply path at the time of the closed loop of the current mode. An impedance of the equivalent circuit, as viewed from the LSI 22, is a power supply-ground impedance Z2 at the time when the low-side transistor (low-side FET 203) is turned on. As shown in FIG. 11, the inductance component of the coil 204 is ignored, and the ESR of the coil 204 affects the impedance of the equivalent circuit.

FIG. 12 shows a variation of an electric current I flowing in the power plane VCC (i.e. a current drawn in the LSI 22). The LSI 22 operates at high speed. Accordingly, not only a static current I, but also a current I, which dynamically varies in accordance with the switching operation of the logic circuit within the LSI 22, is drawn into the LSI 22.

FIG. 13 shows frequency characteristics of the current I. As is understood from FIG. 13, the current I is large in the low frequency region, and the current I gradually decreases as the frequency becomes higher.

Figure 14:
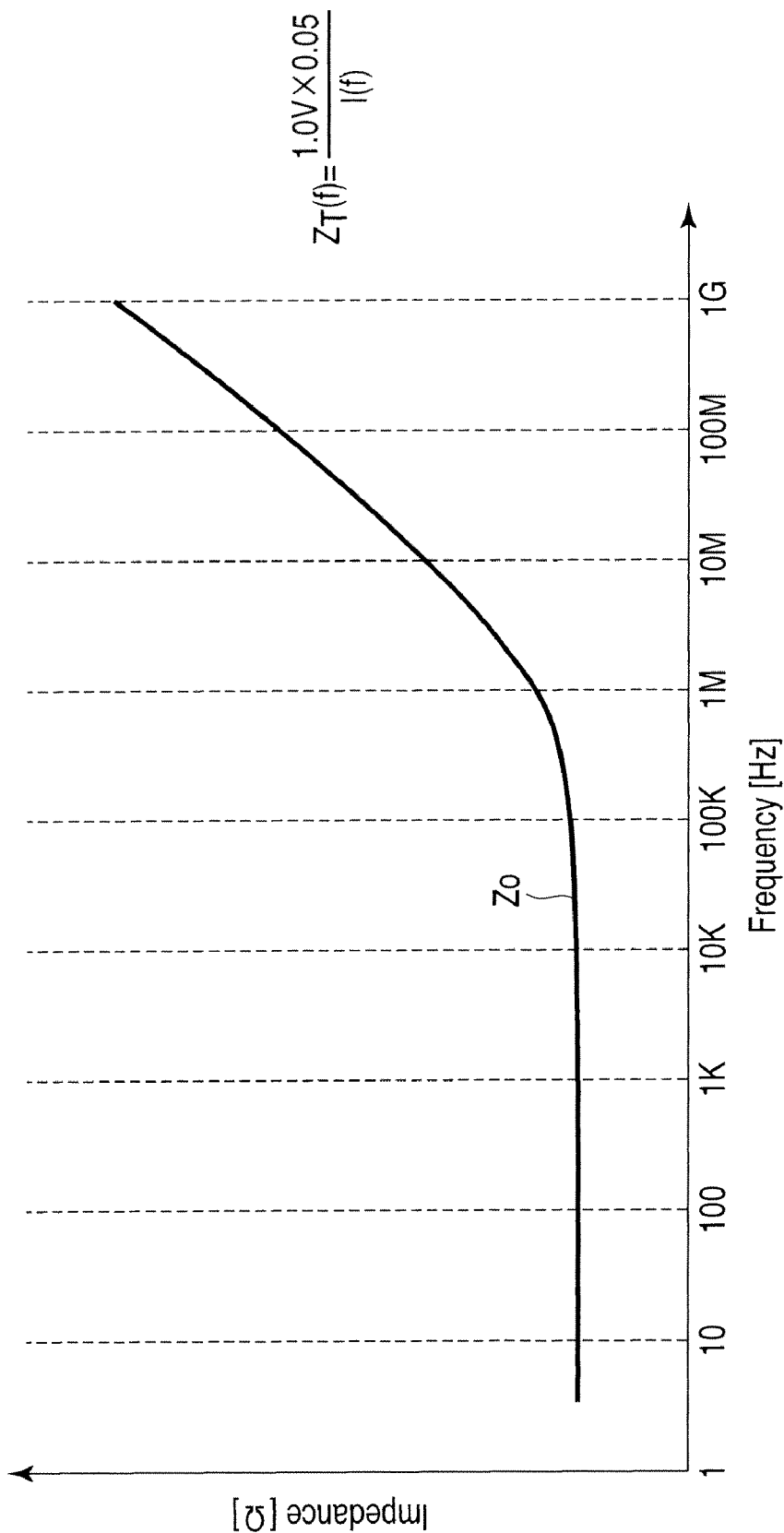
FIG. 14 is an exemplary graph showing an example of a target impedance which is applied to the printed circuit board shown in FIG. 2.

FIG. 14 shows frequency characteristics of a target impedance.

The target impedance $Z_T(f)$ can be expressed by the following equation:

$$Z_T(f) = \text{maximum tolerable voltage drop}/I(f)$$

where the maximum tolerable voltage drop is expressed by a product between the power supply voltage V of the LSI 22 and the tolerable voltage error % of the LSI 22. In FIG. 14, the case is assumed in which the power supply voltage V of the LSI 22 is 1 V and the tolerable voltage error % of the LSI 22 is 5%. As has been described with reference to FIG. 13, the current I(f) becomes lower as the frequency becomes higher. Accordingly, the target impedance $Z_T(f)$ has such characteristics that the target impedance $Z_T(f)$ becomes higher as the frequency becomes higher.

FIG. 15 shows the power supply-ground impedances corresponding to the voltage mode and the current mode. In general, a measure, such as arrangement of decoupling capacitors, has to be taken so that the power supply-ground impedance may decrease to below the target impedance. However, the power supply-ground impedance is different, as shown in FIG. 15, between the time of the voltage mode (high-side FET 202 is "ON") and the time of the current mode (low-side FET 203 is "ON"). Thus, the measure for designing to secure the power integrity varies depending on whether use is made of the power supply-ground impedance Z1 at the ON time of the high-side PET 202 or the power supply-ground impedance Z2 at the ON time of the low-side FET 203. In the prior art, in many cases, the measure for designing to secure the power integrity has been taken by always using the power supply-ground impedance Z1, regardless of the ratio of the ON period of the high-side FET 202.

In the present embodiment, based on the ratio of the ON period of the high-side FET 202, the optimal impedance is selected from among the power supply-ground impedance Z1 at the ON time of the high-side FET 202, the power supply-ground impedance Z2 at the ON time of the low-side FET 203, and the impedance Z3 between Z1 and Z2, and the measure for designing to secure the power integrity is carried out by using the selected impedance.

FIG. 16 shows signal waveforms (oscilloscope waveforms) of switching control signals of the DC to DC converter, which are measured by the measuring device 20. As is understood, the low-side FET 203 is turned off while the high-side FET 202 is turned on, and the high-side PET 202 is turned off while the low-side FET 203 is turned on. If the period in which the high-side FET 202 is turned on becomes longer, the influence on the power supply-ground impedance by the voltage mode becomes greater than the influence on the power supply-ground impedance by the current mode. Hence, in this case, it is necessary to perform designing to secure power integrity by using the power supply-ground impedance Z1 at the ON time of the high-side transistor 202.

On the other hand, if the period in which the high-side FET 202 is turned on is short, the influence on the power supply-ground impedance by the current mode becomes greater than the influence on the power supply-ground impedance by the voltage mode. Hence, in this case, it should suffice if designing to secure power integrity is performed by using the power supply-ground impedance Z2 at the ON time of the low-side transistor 203.

In the present embodiment, based on the ratio of the ON period of the high-side PET 202 to the switching cycle T, one of the power supply-ground impedance Z1 at the ON time of the high-side FET 202, the power supply-ground impedance Z2 at the ON time of the low-side FET 203, and the impedance Z3 between Z1 and Z2 is determined, as described below, as the power supply-ground impedance which is suited to the printed circuit board that is the object of design.

Specifically, when Time_high_on>A, the power supply-ground impedance Z1 at the ON time of the high-side FET 202 is determined as the power supply-ground impedance which is suited to the printed circuit board that is the object of design. The "Time_high_on" is the ratio of the ON period of the high-side FET 202 to the switching cycle T. The value "A" is a threshold, and "B" is a threshold which is lower than "A". When A>Time_high_on>B, the impedance Z3 (e.g. a middle value between Z1 and Z2) is determined as the power supply-ground impedance which is suited to the printed circuit board that is the object of design. When B>Time_high_on, the power supply-ground impedance Z2 at the ON time of the low-side FET 203 is determined as the power supply-ground impedance which is suited to the printed circuit board that is the object of design.

Figure 17:
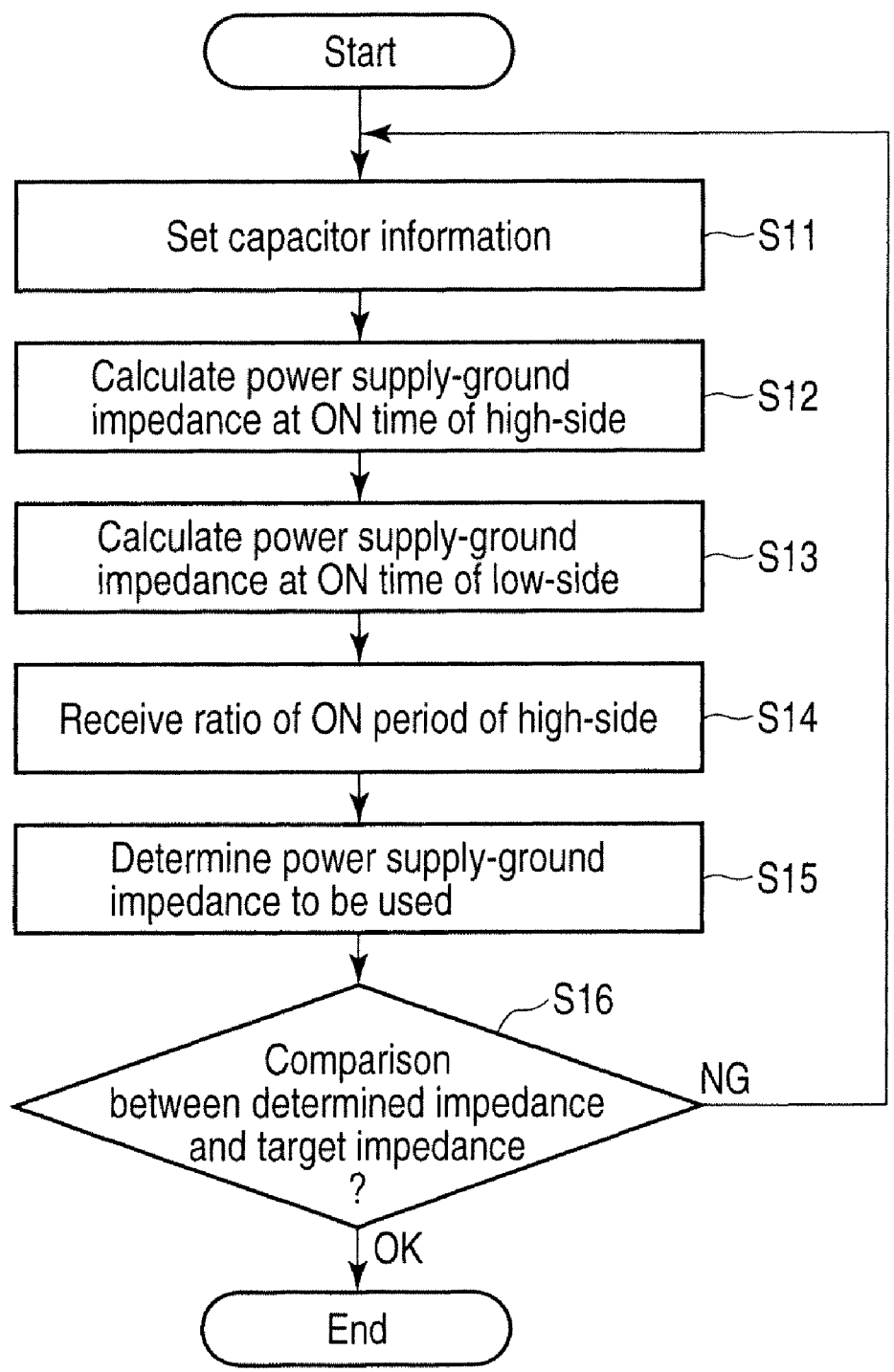
FIG. 17 is an exemplary flow chart illustrating an example of the procedure of a decoupling capacitor optimizing process which is executed by the design support apparatus of the embodiment.

Next, referring to a flow chart of FIG. 17, a description is given of the procedure of a design support process which is executed by the design support apparatus of the embodiment.

To start with, the design support apparatus sets capacitor information (step S11). In step S11, the design support apparatus reads, from the design information storage module 132, the capacitor information which is indicative of the number of decoupling capacitors which need to be mounted on the printed circuit board that is the object of design, or the capacitance of each of the decoupling capacitors. Then, using the capacitor information and other design information, the design support apparatus calculates the power supply-ground impedance Z1 at the ON time of the high-side FET 202 (step S12). In step S12, the impedance of the equivalent circuit shown in FIG. 10 is calculated as the power supply-ground impedance Z1 at the ON time of the high-side FET 202. Further, using the capacitor information and other design information, the design support apparatus calculates the power supply-ground impedance Z2 at the ON time of the low-side FET 203 (step S13). In step S13, the impedance of the equivalent circuit shown in FIG. 11 is calculated as the power supply-ground impedance Z2 at the ON time of the low-side FET 203.

Thereafter, the design support apparatus receives, from the external measuring device 20 or input device 11, the ON-time information which indicates the ratio of the ON period of the high-side transistor to the switching cycle in the operation period of the device (step S14). Then, based on the ON time information, the design support apparatus determines one of the impedance Z1, the impedance Z2 and the impedance Z3 in the intermediate range between the impedance Z1 and impedance Z2 (e.g. the middle value between Z1 and Z2) to be the power supply-ground impedance which is suited to the printed circuit board that is the object of design (step S15). The design support apparatus compares the determined power supply-ground impedance and the pre-calculated target impedance $Z_T$, and evaluates, based on the comparison result, the number of decoupling capacitors or the capacitance of each decoupling capacitor, which is indicated by the capacitor information (step S16).

If the determined power supply-ground impedance is sufficiently lower than the target impedance $Z_T$, the design support apparatus returns to step S11 and changes the capacitor information so that the number of decoupling capacitors used is decreased or the capacitance of each decoupling capacitor used is decreased. Subsequently, the design support apparatus re-executes the process of steps S12 to S16. In this manner, the number of decoupling capacitors or the capacitance of each decoupling capacitor is optimized so that the determined power supply-ground impedance may become just below the target impedance $Z_T$.

On the other hand, if the determined power supply-ground impedance is higher than the target impedance $Z_T$, the design support apparatus returns to step S11 and changes the capacitor information so that the number of decoupling capacitors used is increased or the capacitance of each decoupling capacitor used is increased. Subsequently, the design support apparatus re-executes the process of steps S12 to S16. In this manner, the number of decoupling capacitors or the capacitance of each decoupling capacitor is optimized so that the determined power supply-ground impedance may become just below the target impedance $Z_T$.

As has been described above, in the design support apparatus of the embodiment, the power supply-ground impedance, which is suited to the printed circuit board that is the object of design, is determined in consideration of the operation state of the switching power supply. It is possible, therefore, to prevent such a situation from occurring that an excessive number of decoupling capacitors or a decoupling capacitor with an excessive capacitance, is disposed, and to support optimization of the number of decoupling capacitors which are to be disposed on the printed circuit board, or the capacitance of each decoupling capacitor which is to be disposed.

All the functions of the design support apparatus of the embodiment are realized by a computer program. Thus, the same advantageous effects as with the present embodiment can easily be obtained simply by installing the computer program into an ordinary computer through a computer-readable storage medium which stores the computer program.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A design support apparatus configured to support design of a printed circuit board on which a device and a switching power supply, which supplies power to the device, are mounted, comprising:
    a calculation module configured to calculate, based on design information of the printed circuit board including capacitor information indicative of characteristics of at least one decoupling capacitor, a first impedance between a power plane and a ground plane in the printed circuit board at an ON time of a high-side transistor in the switching power supply, and a second impedance between the power plane and the ground plane at an ON time of a low-side transistor in the switching power supply;
    a determination module configured to determine one of the first impedance, the second impedance and a third impedance in an intermediate range between the first impedance and the second impedance to be an impedance between the power plane and the ground plane, based on ON-time information indicative of a ratio of an ON period of the high-side transistor to a switching cycle of the switching power supply in an operation period of the device; and
    an evaluation module configured to evaluate the capacitor information by comparing the determined impedance and a target impedance.

2. The design support apparatus of claim 1, further comprising a measuring module configured to measure, with use of a board for evaluation on which the device and the switching power supply are mounted, the ratio of the ON period of the high-side transistor to the switching cycle of the switching power supply.

3. The design support apparatus of claim 1, wherein the determination module is configured to determine the first impedance to be the impedance between the power plane and the ground plane, when the ratio of the ON period of the high-side transistor is greater than a first threshold, and to determine the second impedance to be the impedance between the power plane and the ground plane, when the ratio of the ON period of the high-side transistor is not greater than the first threshold.

4. The design support apparatus of claim 1, wherein the determination module is configured to determine the first impedance to be the impedance between the power plane and the ground plane, when the ratio of the ON period of the high-side transistor is greater than a first threshold, to determine the second impedance to be the impedance between the power plane and the ground plane, when the ratio of the ON period of the high-side transistor is less than a second threshold which is lower the first threshold, and to determine the third impedance to be the impedance between the power plane and the ground plane, when the ratio of the ON period of the high-side transistor is not greater than the first threshold and is not less than the second threshold.

5. A design support method of supporting design of a printed circuit board on which a device and a switching power supply, which supplies power to the device, are mounted, comprising:

calculating, based on design information of the printed circuit board including capacitor information indicative of characteristics of at least one decoupling capacitor, a first impedance between a power plane and a ground plane in the printed circuit board at an ON time of a high-side transistor in the switching power supply, and a second impedance between the power plane and the ground plane at an ON time of a low-side transistor in the switching power supply;

determining one of the first impedance, the second impedance and a third impedance in an intermediate range between the first impedance and the second impedance to be an impedance between the power plane and the ground plane, based on ON-time information indicative of a ratio of an ON period of the high-side transistor to a switching cycle of the switching power supply in an operation period of the device; and evaluating the capacitor information by comparing the determined impedance and a target impedance.

6. The design support method of claim 5, further comprising measuring, with use of a board for evaluation on which the device and the switching power supply are mounted, the ratio of the ON period of the high-side transistor to the switching cycle of the switching power supply.

7. The design support method of claim 5, wherein said determining includes determining the first impedance to be the impedance between the power plane and the ground plane, when the ratio of the ON period of the high-side transistor is greater than a first threshold, and determining the second impedance to be the impedance between the power plane and the ground plane, when the ratio of the ON period of the high-side transistor is not greater than the first threshold.

8. The design support method of claim 5, wherein said determining includes determining the first impedance to be the impedance between the power plane and the ground plane, when the ratio of the ON period of the high-side transistor is greater than a first threshold, determining the second impedance to be the impedance between the power plane and the ground plane, when the ratio of the ON period of the high-side transistor is less than a second threshold which is lower the first threshold, and determining the third impedance to be the impedance between the power plane and the ground plane, when the ratio of the ON period of the high-side transistor is not greater than the first threshold and is not less than the second threshold.

9. An apparatus comprising:

a calculation module configured to calculate, based on design information of a printed circuit board including capacitor information indicative of characteristics of a decoupling capacitor, a first impedance between a power plane and a ground plane in the printed circuit board at an ON time of a high-side transistor in a switching power supply, and a second impedance between the power plane and the ground plane at an ON time of a low-side transistor in the switching power supply;

a determination module configured to determine one of impedances falling within a range between the first impedance and the second impedance to be an impedance between the power plane and the ground plane, based on ON-time information indicative of a ratio of an ON period of the high-side transistor to a switching cycle of the switching power supply in an operation period of a device on the printed circuit board; and an evaluation module configured to evaluate the capacitor information based on the determined impedance.

10. An apparatus comprising:

a calculation module configured to calculate a first impedance between a power plane and a ground plane in a printed circuit board at an ON time of a high-side transistor in a switching power supply, and a second impedance between the power plane and the ground plane at an ON time of a low-side transistor in the switching power supply; and an evaluation module configured to determine one of impedances falling within a range between the first impedance and the second impedance to be an impedance between the power plane and the ground plane, based on a ratio of an ON period of the high-side transistor to a switching cycle of the switching power supply, and to evaluate, based on the determined impedance, capacitor information included in design information of the printed circuit board and indicative of characteristics of a decoupling capacitor.

* * * * *